(12) United States Patent
Machnicki et al.

(10) Patent No.: US 8,963,587 B2
(45) Date of Patent: Feb. 24, 2015

(54) CLOCK GENERATION USING FIXED DIVIDERS AND MULTIPLEX CIRCUITS

(71) Applicant: Apple Inc., Cupertino, CA (US)

(72) Inventors: Erik P. Machnicki, San Jose, CA (US); Raman S. Thiara, San Jose, CA (US); Shane J. Keil, San Jose, CA (US); Timothy J. Millet, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/893,926

(22) Filed: May 14, 2013

(65) Prior Publication Data

US 2014/0340130 A1    Nov. 20, 2014

(51) Int. Cl.
    *H03K 21/00*    (2006.01)
(52) U.S. Cl.
    USPC ........... 327/115; 327/117; 327/291; 327/293; 327/295
(58) Field of Classification Search
    USPC ..................... 327/115, 117, 291, 293–295
    See application file for complete search history.

(56) References Cited

U.S. PATENT DOCUMENTS

| | | | |
|---|---|---|---|
| 6,047,248 A * | 4/2000 | Georgiou et al. | 702/132 |
| 6,289,067 B1 | 9/2001 | Nguyen et al. | |
| 6,466,073 B1 * | 10/2002 | Yukinari et al. | 327/291 |
| 6,750,686 B2 | 6/2004 | Wang | |
| 6,917,662 B2 | 7/2005 | Austin et al. | |
| 7,639,561 B2 * | 12/2009 | Lee et al. | 365/233.11 |
| 7,865,749 B2 * | 1/2011 | Sandon et al. | 713/322 |
| 8,149,979 B2 * | 4/2012 | Buchmann et al. | 375/371 |
| 8,151,268 B2 * | 4/2012 | Jones et al. | 718/102 |
| 8,161,313 B2 * | 4/2012 | Oh | 713/503 |
| 8,164,966 B2 * | 4/2012 | Stratz et al. | 365/201 |
| 8,166,213 B2 * | 4/2012 | Simmons et al. | 710/52 |
| 8,166,361 B2 * | 4/2012 | Ong | 714/738 |
| 2004/0086031 A1 | 5/2004 | Moriwaki | |

* cited by examiner

*Primary Examiner* — Kenneth B. Wells
(74) *Attorney, Agent, or Firm* — Meyertons, Hood, Kivlin, Kowert & Goetzel, P.C.

(57) ABSTRACT

Embodiments of an apparatus are disclosed that may allow for changing the frequency of a clock coupled to a functional block within an integrated circuit. The apparatus may include a plurality of clock dividers and a multiplex circuit. Each of the plurality of clock dividers may divide the frequency of a base clock signal be a respective one of a plurality of divisors. The multiplex circuit may be configured to receive a plurality of selection signals, select an output from one of the plurality of clock dividers dependent upon the received selection signals, and coupled the selected output of the plurality of clock dividers to the functional block.

15 Claims, 7 Drawing Sheets

CLOCK GENERATION USING FIXED DIVIDERS AND MULTIPLEX CIRCUITS

BACKGROUND

1. Technical Field

This invention is related to the field of integrated circuit implementation, and more particularly to the implementation of multiple clock domains.

2. Description of the Related Art

Computing systems may include one or more systems-on-a-chip (SoC), which may integrate a number of different functions, such as graphics processing, onto a single integrated circuit. With numerous functions included in a single integrated circuit, chip count may be kept low in mobile computing systems, such as tablets, for example, which may result in a smaller form factor for such mobile computing systems.

As semiconductor process technology has continued to evolve, device geometries continue to shrink, allowing a higher density of devices per unit area. With an increased density of devices, increased levels of integration may be possible, allowing for more functional blocks with increased complexity to integrated into a single SoC.

With higher levels of integration and higher performing devices, power consumption may be a limiting factor, particularly in mobile computing applications such as, e.g., tablets or cellular telephones. Different design techniques and architectures may be employed to limit dynamic power. In some designs, multiple clock signals may be employed allowing different functional blocks within an SoC to operate at different frequencies, and allowing clocks to be stopped for a given functional block within the SoC when the block's functionality is not presently required. Other designs may allow for the frequency of a clock to a functional block to be changed responsive to variations in demand for compute resources. Some SoC designs may require a large number of clock frequencies. In such cases, clock generation circuitry may be a significant source of dynamic power consumption.

SUMMARY OF THE EMBODIMENTS

Various embodiments of a clock generation circuitry are disclosed. Broadly speaking, a circuit and a method are contemplated in which an apparatus includes a plurality of clock divider circuits and a multiplex circuit. Each of the plurality of clock divider circuits may be configured to divide the frequency of a base clock signal by a given one of a plurality of divisors. The multiplex circuit may be configured to receive a plurality of selection signals, select an output of plurality of clock divider circuits responsive the plurality of selection signals, and couple the selected output of the plurality of clock divider circuits to a functional block of a computing system.

In another embodiment, the multiplex circuit may include a decode circuit. The included decode circuit may be configured to decode the selection signals.

In a further embodiment, the apparatus may include a phase-locked loop (PLL). The PLL may be configured to generate the base clock signal.

BRIEF DESCRIPTION OF THE DRAWINGS

The following detailed description makes reference to the accompanying drawings, which are now briefly described.

Figure 1:
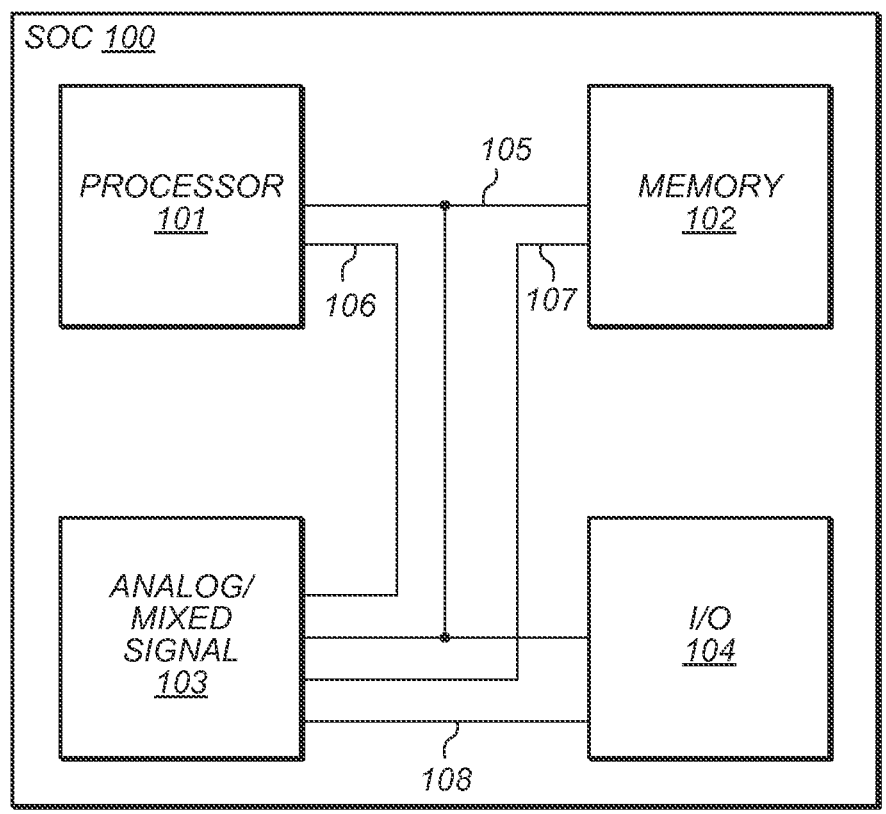
FIG. 1 illustrates an embodiment of a system-on-a-chip.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

To manage power and performance within an SoC, one or more clock domains may be employed. The use of multiple clock domains may allow for local clocks in various functional blocks or portions thereof, to be stopped, preventing the aforementioned blocks from consuming dynamic power during certain periods. In some embodiments, the frequency of the various clocks may be adjusted to allow the functional blocks to operate at lower frequencies during periods of decreased demand for compute resources.

When generating multiple clocks for use within an SoC, the clock generating circuitry may consume significant power during the creation of lower frequency clocks. Dynamically, switching between clocks of different frequencies may also generate undesirable clock edges or "glitches" which may affect performance of a functional block. The embodiments illustrated in the drawings and described below may provide techniques for providing multiple clocks at varying frequencies while limiting the power of the clock generating circuitry and reducing glitches while transitioning from one clock frequency to another.

System-on-a-Chip Overview

A block diagram of an SoC is illustrated in FIG. 1. In the illustrated embodiment, the SoC 100 includes a processor 101 coupled to memory block 102, and analog/mixed-signal block 103, and I/O block 104 through internal bus 105. Analog/mixed signal block 103 may create clock signals 106, 107, and 108 which are coupled to processor 101, memory 102, and I/O block 104, respectively. In some embodiments, each of clock signals 106, 107, and 108 may provide a timing reference to the aforementioned functional blocks. In various embodiments, SoC 100 may be configured for use in a mobile computing application such as, e.g., a tablet computer or cellular telephone. Transactions on internal bus 105 may be encoded according to one of various communication protocols. For example, transactions may be encoded Peripheral Component Interconnect Express (PCIe), or any other suitable communication protocol.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include one or more register files and memories.

In some embodiments, processor 101 may implement any suitable instruction set architecture (ISA), such as, e.g., PowerPC™, or x86 ISAs, or combination thereof. Processor 101 may include one or more bus transceiver units that allow processor 101 to communication to other functional blocks within SoC 100 such as, memory block 102, for example.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), a FLASH memory, Phase Change Memory (PCM), or a Ferroelectric Random Access Memory (FeRAM), for example. In some embodiments, memory block 102 may be configured to store program code or program instructions that may be executed by processor 101. Memory block 102 may, in other embodiments, be configured to store data to be processed, such as graphics data, for example.

It is noted that in the embodiment of an SoC illustrated in FIG. 1, a single memory block is depicted. In other embodiments, any suitable number of memory blocks and memory types may be employed.

Analog/mixed-signal block 103 may include a variety of circuits including, for example, a crystal oscillator, a voltage reference, a current reference, a phase-locked loop (PLL) or delay-locked loop (DLL), an analog-to-digital converter (ADC), and a digital-to-analog converter (DAC) (all not shown). In other embodiments, analog/mixed-signal block 103 may be configured to perform power management tasks with the inclusion of on-chip power supplies, voltage regulators. Clock generating circuitry may, in some embodiments, be included in analog/mixed signal block 103 to generate one or more clocks, such as, e.g., clock signals 106, 107, and 108, for other functional blocks within SoC 100. In various embodiments, snalog/mixed-signal block 103 may also include radio frequency (RF) circuits that may be configured for operation with cellular telephone networks.

I/O block 104 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 104 may be configured to implement a version of Universal Serial Bus (USB) protocol or IEEE 1394 (Firewire®) protocol, and may allow for program code and/or program instructions to be transferred from a peripheral storage device for execution by processor 101.

I/O block 104 may also be configured to coordinate data transfer between SoC 100 and one or more devices (e.g., other computer systems or SoCs) coupled to SoC 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

Each of the functional blocks included in SoC 100 may be included in separate power and/or clock domains. In some embodiments, a functional block may be further divided into smaller power and/or clock domains. Each power and/or clock domain may, in some embodiments, be separately controlled thereby selectively deactivating (either by stopping a clock signal or disconnecting the power) individual functional blocks or portions thereof. Although three clock signals are depicted in SoC 100, in other embodiments, additional clock signals operating at different frequencies may be employed for each functional block and/or clock domain.

It is noted that the SoC illustrated in FIG. 1 is merely an example. In other embodiments, different functional blocks and different configurations of functions blocks may be possible dependent upon the specific application for which the SoC is intended.

Clock Generation and Distribution

Figure 2:
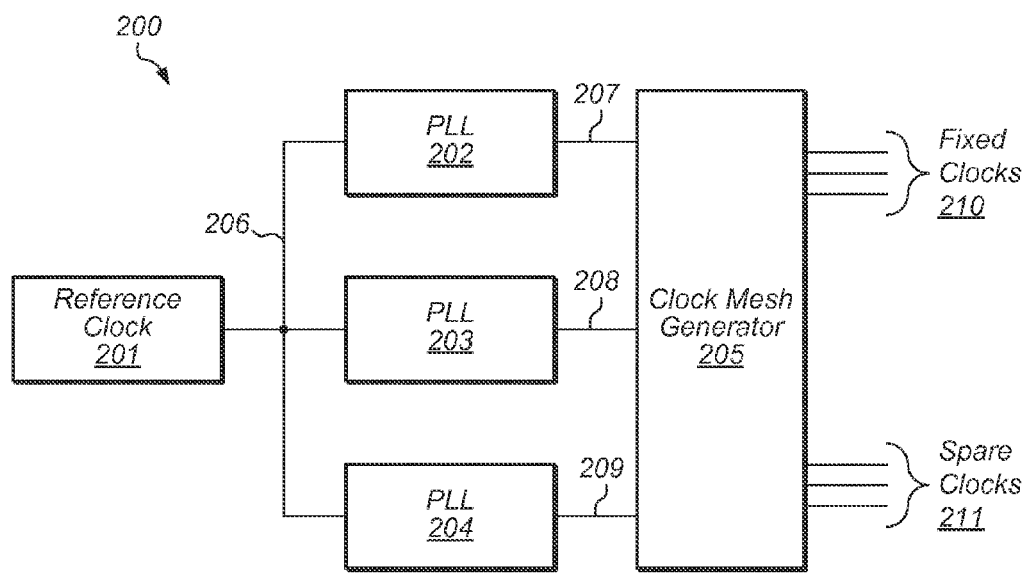
FIG. 2 illustrates an embodiment of a clock mesh generator.

Turning to FIG. 2, an embodiment of clock generator unit is illustrated. In the illustrated embodiment, clock generator unit 200 includes reference clock generator 201, phase-locked loops (PLLs) 202 through 204, and clock mesh generator 205. In some embodiments, clock generator unit 200 may be included in a functional block of an SoC such as, e.g., analog/mixed-signal block 103 of SoC 100 as illustrated in FIG. 1.

Reference clock generator 201 may be configured to create reference clock 206 at a pre-determined frequency. In some embodiments, reference clock generator 201 may include a crystal oscillator, voltage-controller oscillator, or any other suitable frequency generation circuit. The generated reference frequency may, in other embodiments, be tolerant of variation in temperature of voltage level of a power supply.

Each of PLLs 202 through 204 may be configured to phase lock base clock signals 207 through 209 to reference clock 206. In some embodiments, PLLs 202 through 204 may be configured to generate base clock signals 207 through 209 at frequencies higher or lower than reference clock 206 while maintain a phase relationship with reference clock 206. PLLs 202 through 204 may include charge pumps, analog or digital delay lines, and other circuitry suitable for performing phase locking Clock mesh generator 205 is coupled to receive base clocks 207 through 209 and to generate fixed clocks 210 and spare clocks 211 (collectively a "clock mesh"). In various embodiments, clock mesh generator 205 may include one or more frequency divider circuits, and one or more multiplex circuits. The frequency dividers circuits may be configured to delay one or more of base clocks 207 through 209 to create clocks with various frequencies. The multiplex circuits may be configured to select one or more of the clocks with various frequencies and coupled the selected clocks to the clock mesh.

One or more buffers (not shown) may be used to drive each clock signal included in the clock mesh. In some embodiments, a buffer may include two inverters coupled together in series, a unity-gain non-inverting amplifiers, or any other suitable circuit. Each clock signal may be routed to one or more functional blocks. The routing may be performed using multiple conductive layers such as, e.g., copper or aluminum, included in a semiconductor manufacturing process.

It is noted that static complementary metal-oxide semiconductor (CMOS) inverters, such as those shown and described herein, may be particular embodiments of inverting amplifiers that may be employed in the circuits described herein. However, in other embodiments, any suitable configuration of inverting amplifier that is capable of inverting the logical sense of a signal(s) and performing logical work may be used including inverting amplifiers built using technology other than CMOS.

It is noted that the clock generator illustrated in FIG. 2 is merely an example. In other embodiments, different numbers of power domains and different configurations of circuit elements with the power domains are possible.

Figure 3:
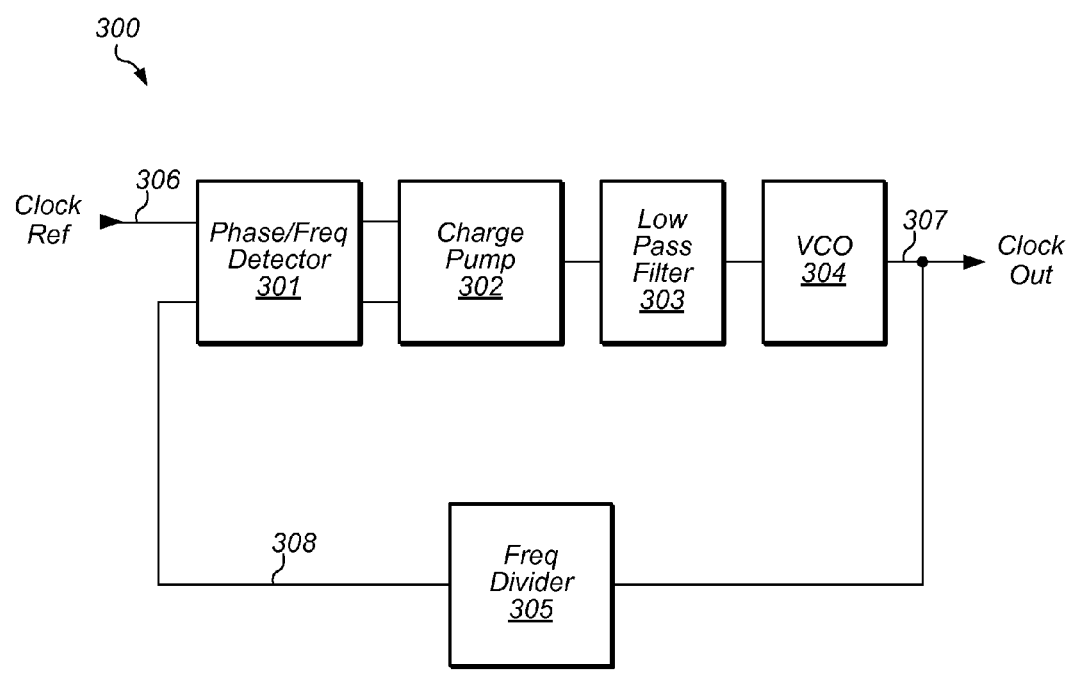
FIG. 3 illustrates an embodiment of a phase-locked loop.

Turning to FIG. 3, a block diagram of an embodiment of a phase-locked loop is illustrated, which may correspond to PLLs 202 through 204 as illustrated in FIG. 2. In the illustrated embodiment, PLL 300 includes phase frequency detector 301, change pump 302, low pass filter 303, voltage-controlled oscillator (VCO) 304, and frequency divider 305. The inputs of phase detector 301 are coupled to reference clock 306 and the output of frequency divider 305. The outputs of phase detector 301 are coupled to the inputs of change pump 302. The output of charge pump 302 is coupled to the input of VCO 304 through low pass filter 303. Output clock 307 is coupled to the output of VCO 304 and to the input of frequency divider 305.

Phase frequency detector 301 may be configured to compare reference clock 306 and the output of frequency divider 308, and to generate one or more error signals proportional to the phase difference between the compared signals. In some embodiments, phase frequency detector 301 may be implemented by summing the output of two analog multipliers, such as, double balance diode mixer or a four-quadrant multiplier (Gilbert Cell), for example. Phase frequency detector 301 may, in some embodiments, implemented using exclusive-OR logic gates, flip-flops, or any other suitable combination of digital logic gates.

Charge pump 302 may be configured to charge and discharge a capacitor dependent upon the output of phase frequency detector 301. In some embodiments, phase frequency detector 301 provides two output signals, commonly referred to as "up" and "down," which may signal charge pump to source current to the capacitor, or sink current from the capacitor, respectively. In such cases, the voltage across the capacitor is proportional to the phase difference between reference input 306 and the output of frequency divider 305. Charge pump 302 may, in various embodiments, employ one or more p-channel metal-oxide field-effect transistors (MOSFETs) to source current to the capacitor, and one or more n-channel MOSFETs to sink current from the capacitor. In other embodiments, a resistor may be added in series with the capacitor to improve stability of the circuit.

Low pass filter 303 (also referred to as a "loop filter") may be configured to remove high-frequency noise on the output of charge pump 302. In some embodiments, the cutoff frequency of the low pass filter may be selected to determine the capture range of PLL 300. Low pass filter 303 may, in some embodiments, be implemented as a passive filter consisting of resistors and capacitors. In other embodiments, low pass filter 303 may be implemented as an active filter employing an amplifier, such as, e.g., an operational amplifier (commonly referred to as an "op-amp") and a feedback path, which may include both resistors and capacitors.

Voltage-controlled oscillator 304 may be configured to output a frequency dependent upon the filtered output of charge pump 302, and may be implemented as either a harmonic oscillator, or a relaxation oscillator, or any other suitable oscillator circuit topology. In some embodiments, a varying current may charge or discharge a capacitor thereby adjusting the frequency of VCO 304. The varying current may be dependent upon the output of charge pump 302, which may be used to adjust current sources with VCO 304. In other embodiments, the output of charge pump 302 may be employed to adjust the gain of amplifier stages, which are coupled together in a ring.

Frequency divider 305 may be configured to divide the frequency of output clock 307 by a predetermined value. The resultant divided frequency may then be input to phase frequency detector 301, thereby allowing for a frequency on output clock 307 that is different than reference input 306. In some embodiments, frequency divider 305 may include one or more flip-flops configured to divide their input frequency by a factor of two. Frequency mixers or multipliers may, in other embodiments, be included in frequency divider 305.

During operation, a pre-determined frequency is applied to reference clock 306. In some embodiments, a crystal oscillator, an RC oscillator, an LC oscillator, or any suitable circuit for generating a frequency reference may be employed to generate the pre-determined frequency. Phase frequency detector 301 may then compare the input frequency to the output of frequency divider 305. Initially, the input frequency and the output of frequency divider 305 may differ in frequency and phase. In some embodiments, the pre-determined frequency must be within a range of frequencies in order for PLL 300 to operate. This range may be referred to as a "capture range" and may be a function of the bandwidth of the low pass filter 303 as well as the capabilities of VCO 304.

When the pre-determined frequency is higher than the frequency of the output of frequency divider 305, phase frequency detector may signal to charge pump 302 to add charge to a capacitor included within the charge pump. When the pre-determined frequency is lower than the frequency of the output of frequency divider 305, phase frequency detector 301 may signal to charge pump 302 to remove charge from the capacitor. In other embodiments, the signal to charge pump 302 to add or subtract charge from the capacitor, may operate in a reverse fashion from the description above, i.e., when the pre-determined frequency is lower than the frequency of the output of frequency divider 305, phase frequency detector 301 may signal to charge pump 302 to add charge to the capacitor, and vice versa.

The voltage across the capacitor included within the charge pump may then be filtered through low pass filter 303. High frequency components of the voltage level across the capacitor may be the result of power supply noise, switching noise within charge pump 302, and the like. Low pass filter 303 may provide a low impedance to ground for the aforementioned high frequency components, thereby preventing the high frequency components from entering VCO 304.

VCO 304 may then generate an output signal at a frequency corresponding to the voltage output from low pass filter 303. The output of VCO 304 may be buffered and used a clock or timing reference within a functional block such as video processor 203 or display controller 209 as illustrated in FIG. 2. In some embodiments, the frequency of the output of VCO 304 may be divided by frequency divider 305, and input to phase frequency detector 301. As described above, frequency divider 305 may, in some embodiments, include frequency mixers and multipliers, which may allow for the output of VCO 304 to be higher or lower in frequency than the input pre-determined frequency, while still being in phase with the input frequency. When the output of frequency divider 305 is in phase with the pre-determined frequency, PLL 300 is said to be "locked." Variations in phase between the two signals induced by changes in the input frequency, fluctuations in power supply voltage, etc., will be compensated by the feedback with PLL 300 in order to maintain the phase relationship between the two signals.

It is noted that PLL 300 as illustrated in FIG. 3 is merely an example. In other embodiments, different functional blocks, and different implementations of functional blocks are possible and contemplated.

Figure 4:
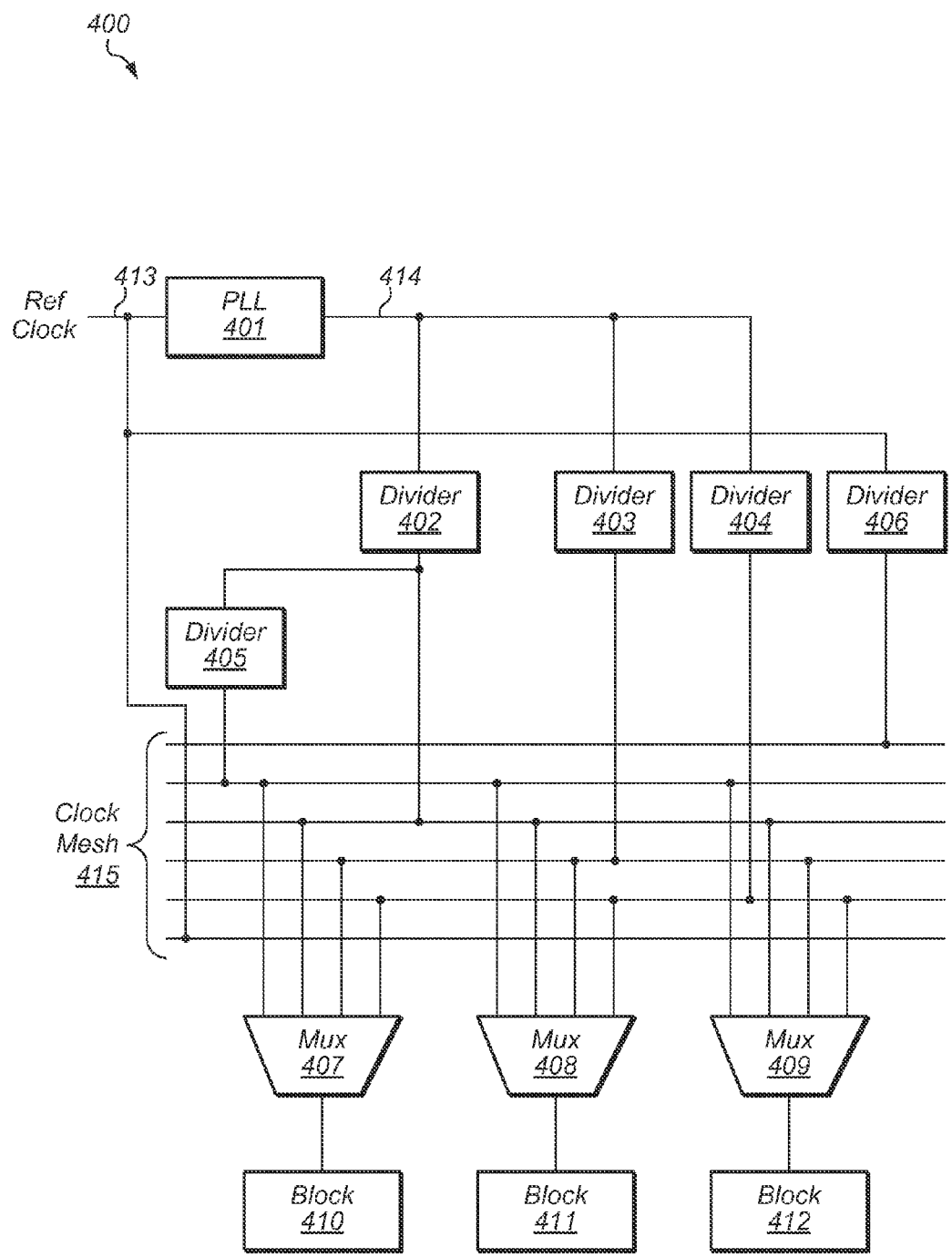
FIG. 4 illustrates another embodiment of a clock mesh generator.

Turning to FIG. 4, another embodiment of a clock mesh generator is illustrated. In some embodiments, clock mesh generator 400 may be included in analog/mixed signal block 103 of SoC 100 as illustrated in FIG. 1. In the illustrated embodiment, clock mesh generator 400 includes PLL 401, frequency divider circuits 402 through 406, and multiplex circuits 407 through 409.

PLL 401 is configured to receive reference clock signal 413 and generate base clock signal 414. A crystal oscillator or other suitable frequency reference circuit may, in some embodiments, be employed to generate reference clock signal 413. In some embodiments, PLL 401 may operate in a similar fashion to PLL 300 as illustrated in FIG. 3. A digital delay-locked loop (DLL) may, in other embodiments, be employed for PLL 401. In some embodiments, reference clock signal 413 may be coupled directly into clock mesh 415.

Frequency divider circuits 402 through 404 are coupled to receive base clock 414, frequency divider circuit 405 is coupled to receive the output of frequency divider circuit 402, and frequency divider 406 is coupled to receive reference clock signals 413. In some embodiments, each of frequency divider circuits 402 through 405 may be configured to divide the frequency of its respective input signal by a fixed divisor in order to generate an output signal. Each frequency divider circuit may, in other embodiments, employ different divisors, or programmable divisors that may be set dependent upon application software or based on one or more system operational parameters. The output of each frequency divider circuit may be connected to a clock signal included in clock mesh 415. In some embodiments, frequency divider circuits 402 through 405 may be a Miller frequency divider, an injection-locked frequency divider, or any other suitable analog frequency divider circuit. Digital circuits may, in other embodiments, be employed to divide an input clock's frequency. In various embodiments, the use of fixed divisors in one or more frequency divider circuits may result in a reduction in both area and power consumption of the clock generation circuit.

Multiplex circuits 407 through 409 are coupled to each of the clock signals included in clock mesh 415, and are each configured to selectively coupled a clock signal included in clock mesh to a functional block dependent upon selection signals (not shown). A reduction in power of the clock generation circuit may be achieved in some embodiments by coupling one or more of multiplex circuits 407 through 409 to a subset of the clocks signals included in clock mesh 415.

The outputs of multiplex circuits 407, 408, and 409 are coupled to functional blocks 410, 411, and 412, respectively. In various embodiments, functional blocks 410 through 412 may correspond to one or more of the functional blocks of SoC 100 such as, e.g., processor 101. Although functional blocks 410 through 412 are depicted as receiving a single clock signal from a respective multiplex circuit, in some embodiments, a functional block may receive multiple clock signals from multiple multiplex circuits.

The operation of multiplex circuits 407 through 409 may be performed in various methods. For example, in some embodiments, multiplex circuits 407 through 409 may be individually controlled to allow a different clock from clock mesh 415 to be coupled to functional blocks 410 through 412. In other embodiments, a subset of multiplex circuits 407 through 409 may be controlled together. Selection circuits that control multiplex circuits 407 through 409 may be set one or more data bits in control registers or memories. The state of the control bits may be established during startup of the system and, in some embodiments, be changed dependent on various parameters such as, e.g., system performance, application software performance, etc.

Each of multiplex circuits 407 through 409 may be constructed in accordance with one of various design styles. For example, in some embodiments, multiplex circuits 407 through 409 may include a plurality of tri-state buffers whose outputs are coupled together in a wired-OR fashion, and whose control inputs are dependent upon one of the selection inputs (not shown). In other embodiments, multiplex circuits 407 through 409 may include a plurality of logic gates configured to implement the desired multiplex.

In some embodiments, multiplex circuits 407 through 409 may be included in functional blocks 410 through 412, respectively. Multiplex circuits 407 through 409 may, in various other embodiments, be included in a common functional block within a SoC such as, e.g., analog/mixed signal block 103 of SoC 100 as illustrated in FIG. 1.

Although four clock signals are depicted as being part of clock mesh 415, it is noted that in other embodiments, different numbers of clock signals, different numbers of divider and multiplex circuits are possible and contemplated.

Figure 5:
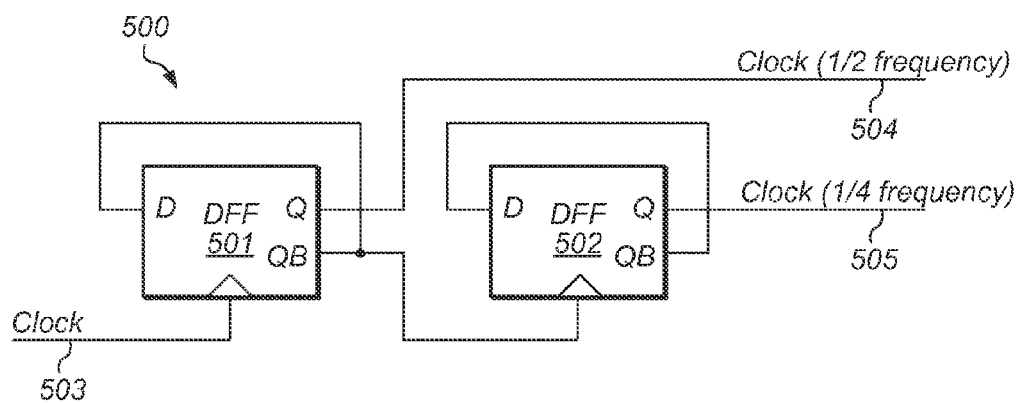
FIG. 5 illustrates an embodiment of a frequency divider.

An embodiment of a frequency divider circuit is illustrated in FIG. 5. In some embodiments, frequency divider 500 may correspond to one or more of frequency dividers 402 through 406 as illustrated in FIG. 4. Frequency divider 500 may, in various embodiments, be configured to employ any of various divisors including a positive integer, a multiple of one-half, an arbitrary fraction, or any suitable divisor. In the illustrated embodiment, frequency divider 500 employs includes D flip-flops (commonly referred to as "data" or "delay" flip-flops) to perform frequency division. In various embodiments, D flip-flops (DFF) capture the logic value at the D-input of the flip-flop during a portion of a clock cycle. The captured value may then propagate to the Q output of the flip-flop and the complement of the captured value may then propagate to the QB output of the flip-flop. During the remaining portion of the clock cycle, the value of the Q and QB output of the flip-flop may not change.

Flip-flops and latches, such as those shown and described herein may be designed according to one of various design styles. For example, latches and flip-flops may be implemented using either dynamic or static circuits, or a combination thereof. In some embodiments, each flip-flop or latch circuit may include scan cells as part of the implementation of a boundary scan test circuit.

In the illustrated embodiment, frequency divider 500 includes DFF 501 and 502. The clock input of DFF 501 is coupled to clock 503, and the QB output of DFF 501 is coupled to the D input of DFF 501. The Q output of DFF 501 is coupled to half frequency clock 504. The QB output of DFF 501 is further coupled to the clock input of DFF 502. In a similar fashion to DFF 501, the QB output of DFF 502 is coupled to the D input of DFF 502, and the Q output of DFF 502 is coupled to quarter frequency clock 505.

In some embodiments, DFF 501 captures the state of its QB output at a rising edge of clock 503 while, in other embodiments, DFF 501 captures the state of its QB output at a falling edge of clock 503. By capturing the complement of the stored data (i.e., the logic level on the QB output of the DFF 501), the Q output of DFF 501 effectively toggles at half the frequency of the clock 503. In a similar fashion, the Q output of DFF 502 toggles at half of the frequency of the QB output of DFF 501, thereby generating a clock signal at one-quarter of the frequency of clock 503.

It is noted that the frequency divider illustrated in FIG. 5 is merely an example. In other embodiments, different numbers of flip-flops and different types of logic may be employed. Moreover, other circuits, such as, e.g., a numerically controlled oscillator, may also be employed to allow other divisors.

Figure 6:
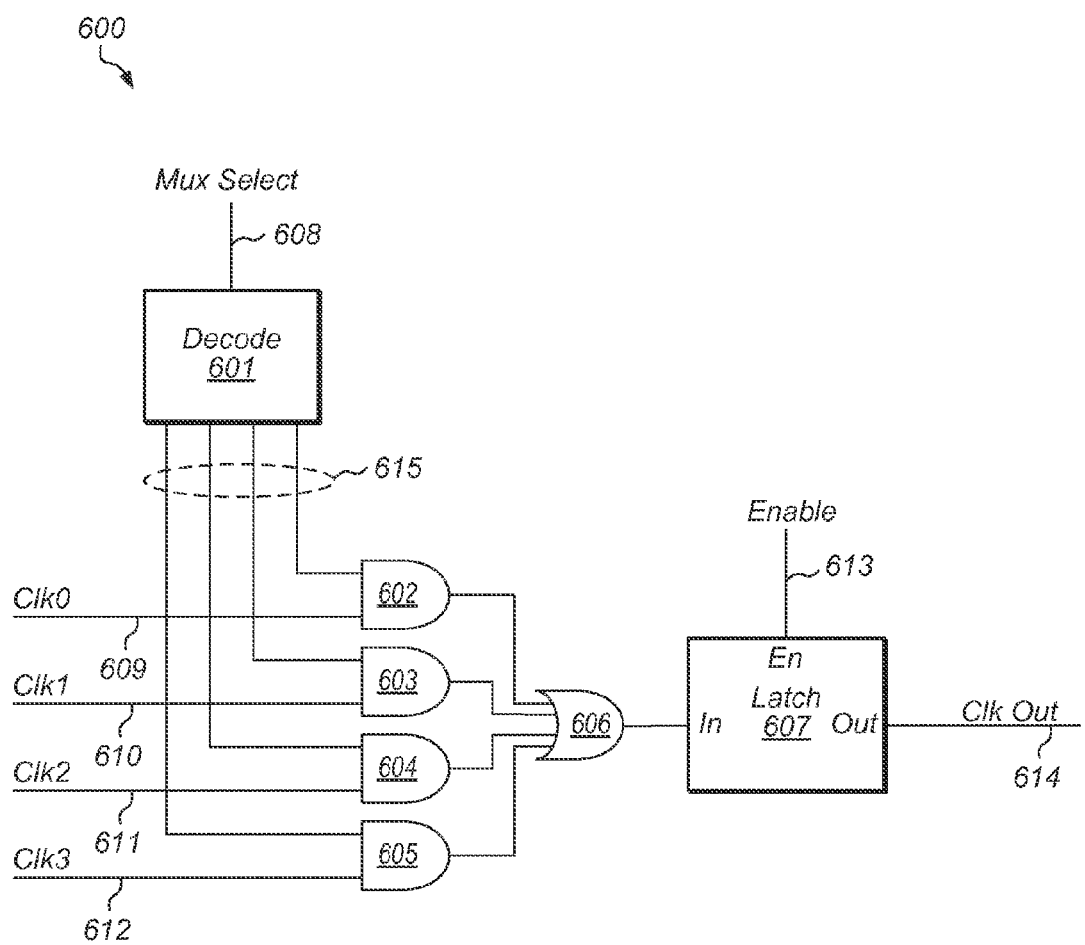
FIG. 6 illustrates an embodiment of a clock multiplex circuit.

Turning to FIG. 6, an embodiment of a multiplex circuit is illustrated. In some embodiments, multiplex circuit 600 may correspond to one of multiplex circuits 406 through 408 as illustrated in FIG. 4. Multiplex circuit 600 includes decode circuit 601, AND gates 602 through 605, OR gate 606, and latch circuit 607. Multiplex circuit selection signals 608 is coupled to decode circuit 601, which generates decode signals 615.

The inputs of AND gates 602 through 605 are coupled to clk0 through clk3 (609 through 612), respectively and decode signals 615. In some embodiments, each of clk0 through clk3 may have a different frequency. The outputs of AND gates 602 through 605 are coupled to the inputs of OR gate 606, whose output, in turn, is coupled to the input of latch 607. The output of latch 607 is coupled to clk out 614, and enable signal 613 controls the operation of latch 607.

The outputs of AND gates 602 through 605 are coupled to the inputs of OR gate 606, whose output, in turn, is coupled to the input of latch 607. The output of latch 607 is coupled to clk out 614, and enable signal 613 controls the operation of latch 607.

Static AND gates, such as those shown and described herein, may be implemented according to several design styles. For example, an AND gate may be implemented as a NAND gate whose output is coupled to an inverter. In other embodiments, an AND gate may be constructed from multiple NAND gates, multiple NOR gates, or any suitable combination of logic gates. In a similar fashion, static OR gates, such as those shown and described herein, may also be implemented according to several design styles. For example, an OR gate may be implemented as a NOR gate whose output is coupled to an inverter, or another suitable combination of logic gates.

Decode circuit 601 may be implemented in accordance to one of various design styles. For example, decode circuit 601 may be implemented using static CMOS logic gates. Alternatively, decoder 601 may be implemented as a dynamic decoder employing collections of n-channel MOSFETs to discharge, in response to selection inputs 610, one or more dynamic circuit nodes that have been pre-charged to a high logic level.

It is noted that "low" or "low logic level" refers to a voltage at or near ground and that "high" or "high logic level" refers to a voltage level sufficiently large to turn on an n-channel MOSFET and turn off a p-channel MOSFET. In other embodiments, different technology may result in different voltage levels for "low" and "high."

During operation, multiplex circuit selections signals 608 may be decoded by decode circuit 601. In response to the decoding of multiplex circuit selections signals 608, one of decode signals 615 may be asserted. One of clk0 through clk3 may then be passed through to OR gate 606 responsive to which of decode signals 615 is asserted. In some embodiments, the output of AND gates whose corresponding decode signal is not asserted may be at a low logic level. OR gate 606 may then combine the outputs of AND gates 602 through 605 and generate an input for latch circuit 607.

In some embodiments, enable signal 613 controls latch circuit 607 such that latch circuit 607 does not propagate the clock when decode circuit 601 is being operated. Once decode circuit 601 has decoded multiplex selection circuit signals 608, and the selected clock has propagated through OR gate 606, latch circuit 607 may be activated to propagate the newly selected clock signal. In some embodiments, enabling latch circuit 607 in such a fashion, may result in a smooth (or "glitchless") transition from one selected clock signal to another.

It is noted that the multiplex circuit illustrated in FIG. 6 is merely an example. In other embodiments, different circuits and a different arrangement of circuits are possible and contemplated.

Figure 7:
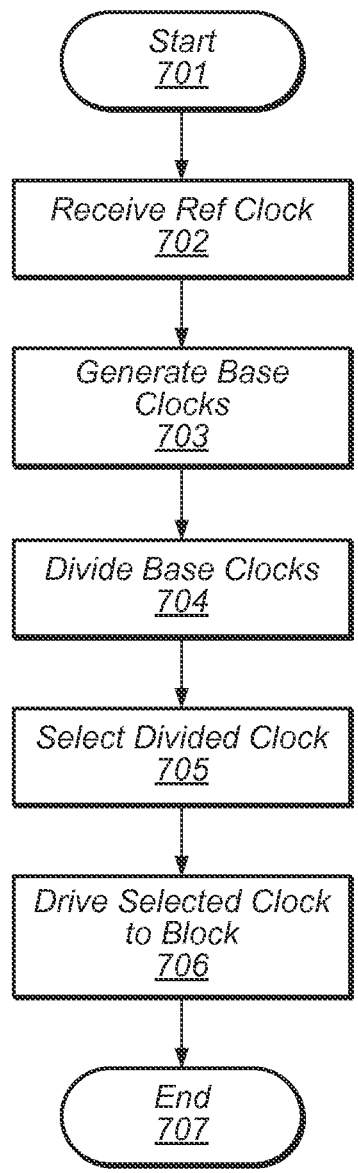
FIG. 7 illustrates a flowchart depicting a method of operating a clock mesh generator.

Turning to FIG. 7, a flowchart depicting an embodiment of operating a clock mesh generator is illustrated. Referring collectively to the clock mesh generator 400 as illustrated in FIG. 4 and the flowchart depicted in FIG. 7, the method begins in block 701. A reference clock may then be received (block 702). In some embodiments, reference clock 413 may be generated by a reference clock generator circuit such as, e.g., reference clock circuit 201 as illustrated in FIG. 2. The received reference clock may, in various embodiments, be the generated using a crystal oscillator, a voltage-controlled oscillator, or any other suitable oscillator circuit.

Received reference clock 413 may then be used to generate a base clock (block 703). In some embodiments, PLL 401 may be used to modify the frequency of reference clock 413 to create base clock signal 414. The frequency of base clock signal 414 may, in some embodiments, be lower than the frequency of reference clock 413 while, in other embodiments, the frequency of base clock signal 414 may be higher than the frequency of reference clock 413.

The frequency of base clock 414 may then be divided (block 704). In some embodiments, one or more frequency divider circuits such as, e.g., divider 402 through 404, may each be configured to receive base clock signal 414, and generate a clock signal included in clock mesh 415. Additional divider circuit such as, divider 405, may be used to divide the frequency of a clock signal output from another divider circuit. Such clock signals may also be included in clock mesh 415. In various embodiments, each of dividers 402 through 405 may employ fixed, i.e., not configurable, divisors.

One of the clock signals included in clock mesh 415 may then be selected (block 705). In some embodiments, multiplex circuits 406 through 408 may perform the selection in response to configuration data, or operational information from a system such as, SoC 100 as illustrated in FIG. 1, for example. Multiplex circuits 406 through 408 may, in various embodiments, correspond to multiplex circuit 600 as illustrated in FIG. 6. In other embodiments, each of multiplex circuits 406 through 408 may be operated independently allowing a different clock signal to be selected from clock mesh 415 for each of functional blocks 409 through 411.

The clock signals selected from clock mesh 415 may then be driven to functional blocks (block 706). In some embodiments, one or more buffers may be employed to drive the selected clock signal from a multiplex circuit to a functional block. The buffers may be a unity-gain amplifier, two inverters connected in series, or any suitable non-inverting amplification circuit. With the selected clock signals being driven to functional blocks, the method may then conclude in block 707.

It is noted that the operations illustrated in the flowchart of FIG. 7 are depicted as being performed in a sequential fashion. In other embodiments, one or more of the illustrated options may be performed in parallel.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a reference clock circuit configured to generate a reference clock;
   a plurality of phase-locked loop (PLL) circuits, wherein each of the PLL circuits is configured to generate a respective one of a plurality of base clock signals dependent upon the reference clock;
   a plurality of clock divider circuits, wherein each clock divider circuit of the plurality of clock divider circuits is configured to divide a frequency of a given base clock signal by a respective one of a plurality of divisors; and
   a plurality of multiplex circuits, wherein each multiplex circuit is configured to:
      receive a plurality of selection signals;
      select an output of the plurality of clock divider circuits dependent upon the received plurality of selection signals; and
      couple the selected output of the plurality of clock divider circuits to a functional block of a computing system.

2. The apparatus of claim 1, wherein each multiplex circuit includes a decode circuit configured to decode the received plurality of selection signals.

3. The apparatus of claim 1, wherein each clock divider circuit of the plurality of clock divider circuits includes one or more flip-flop circuits.

4. The apparatus of claim 1, wherein to couple the selected output of the plurality of clock divider circuits to the functional block each multiplex circuit is further configured to buffer the selected output of the plurality of clock divider circuits.

5. The apparatus of claim 1, wherein each multiplex circuit further includes one or more latch circuits.

6. The apparatus of claim 4, wherein to couple the selected output of the plurality of clock divider circuits each multiplex circuit is further configured to propagate the selected output of the plurality of clock divider circuits responsive to an enable signal.

7. A method, comprising:
   generating a reference clock;
   generating, dependent upon the received reference clock, a plurality of base clocks by a respective plurality of phase-locked loop (PLL) circuits;
   dividing a frequency of a given one of the plurality of base clocks by a respective one of a plurality of divisors by a respective one of a plurality of clock divider circuits to generate a given one of a plurality of clock signals; and
   receiving a plurality of selection signals by a given one of a plurality of multiplex circuits;
   selecting one of the plurality of clock signals by the given one of the plurality of multiplex circuits dependent upon the plurality of selection signals; and
   coupling a given one of a plurality of functional blocks on an integrated circuit to the selected one of the plurality of clock signals by the given one of the plurality of multiplex circuits.

8. The method of claim 7, wherein the generating the plurality of base clocks comprises locking the phase of at least one of the plurality of base clocks to the reference clock.

9. The method of claim 7, wherein coupling the given one of the plurality of functional blocks to the selected one of the plurality of clock signals further comprises decoding the received plurality of selection signals.

10. The method of claim 9, wherein coupling the given one of the plurality of functional blocks to the selected one of the plurality of clock signals further comprises latching the selected one of the plurality of clocks responsive to an enable signal.

11. The method of claim 7, further comprising adjusting the plurality of selection signals dependent upon one or more system operating parameters.

12. A system, comprising:
   a plurality of functional circuit blocks; and
   a clock generation unit, wherein the clock generation unit includes:
      a reference clock circuit configured to generate a reference clock;
      a plurality of phase-locked loop circuits (PLLs), wherein each PLL of the plurality of PLLs is configured to generate a respective one of the plurality of base clock signals dependent upon the reference clock signal;
      a plurality of clock dividers, wherein each clock divider of the plurality of clock dividers is configured to divide the frequency of a given one of the plurality of base clock signals by a given one of a plurality of divisors; and
      a plurality of multiplex circuits, wherein each multiplex circuit is configured to couple an output of a selected one of the plurality of clock dividers to a respective one of the plurality of functional circuit blocks.

13. The system of claim 12, wherein each clock divider of the plurality of clock dividers includes one or more flip-flop circuits.

14. The system of claim 12, wherein the reference clock circuit includes an oscillator circuit.

15. The system of claim 12, wherein each multiplex circuit of the plurality of multiplex circuits includes one or more latch circuits.

* * * * *